(12) United States Patent
Xie et al.

(10) Patent No.: US 11,107,957 B2
(45) Date of Patent: Aug. 31, 2021

(54) LED DEVICE AND BACKLIGHT MODULE

(71) Applicant: FOSHAN NATIONSTAR OPTOELECTRONICS CO., LTD., Foshan (CN)

(72) Inventors: Zhiguo Xie, Foshan (CN); Fuhai Li, Foshan (CN); Dongzi Chen, Foshan (CN); Qinxiu Liu, Foshan (CN)

(73) Assignee: FOSHAN NATIONSTAR OPTOELECTRONICS CO., LTD., Foshan (CN)

( * ) Notice: Subject to any disclaimer, the term of this patent is extended or adjusted under 35 U.S.C. 154(b) by 122 days.

(21) Appl. No.: 16/533,060

(22) Filed: Aug. 6, 2019

(65) Prior Publication Data

US 2020/0287106 A1    Sep. 10, 2020

(30) Foreign Application Priority Data

Mar. 8, 2019 (CN) .......................... 201910177164.4
Mar. 8, 2019 (CN) .......................... 201910177276.X
Mar. 8, 2019 (CN) .......................... 201920296032.9

(51) Int. Cl.
*H01L 33/58* (2010.01)
*H01L 33/52* (2010.01)
(Continued)

(52) U.S. Cl.
CPC ............ *H01L 33/52* (2013.01); *H01L 27/156* (2013.01); *H01L 33/60* (2013.01)

(58) Field of Classification Search
CPC ................ H01L 33/00–648; H01L 27/15–156
See application file for complete search history.

(56) References Cited

U.S. PATENT DOCUMENTS 5,055,892 A * 10/1991 Gardner ................. H01L 33/58
257/99
6,274,890 B1 * 8/2001 Oshio ................... H01L 33/486
257/98
(Continued)

FOREIGN PATENT DOCUMENTS

CN    201421848 Y     3/2010
CN    101852384 A    10/2010
(Continued)

OTHER PUBLICATIONS

Canadian Office Action, dated Oct. 29, 2020. pp. 1-4.

*Primary Examiner* — Eric A. Ward
(74) *Attorney, Agent, or Firm* — Bond Schoeneck & King, PLLC; George McGuire

(57) ABSTRACT

Provided is a LED device and a backlight module. The LED device comprises a bracket, a LED chip and an encapsulation layer. A reflective cup is arranged on the bracket, and the LED chip is arranged in the reflective cup. The encapsulation layer encases and encapsulates the LED chip in the reflective cup, the encapsulation layer has a top surface of the encapsulation layer. The top surface of the encapsulation layer is located above a top surface of the reflective cup, and is a lens curved surface. In an on-state, the LED device has virtual cross sections passing through a geometrical center of the LED chip and perpendicular to a top surface of the bracket, in at least one of the virtual cross sections of the LED device, the LED device has luminous efficiency greater than or equal to 95% within a beam angle of at least 60°.

15 Claims, 5 Drawing Sheets

(51) Int. Cl.
    *H01L 27/15*     (2006.01)
    *H01L 33/60*     (2010.01)

(56) References Cited

U.S. PATENT DOCUMENTS

| | | | | |
|---|---|---|---|---|
| 8,348,445 | B2* | 1/2013 | Nakanishi | G02F 1/133605 |
| | | | | 362/97.3 |
| 8,350,370 | B2* | 1/2013 | Chan | H01L 25/0753 |
| | | | | 257/676 |
| 2007/0205425 | A1* | 9/2007 | Harada | H01L 33/58 |
| | | | | 257/98 |
| 2008/0303040 | A1* | 12/2008 | Chou | H01L 33/60 |
| | | | | 257/89 |
| 2010/0096658 | A1 | 4/2010 | Wu et al. | |
| 2012/0241779 | A1 | 9/2012 | Reeh et al. | |
| 2014/0124812 | A1* | 5/2014 | Kuramoto | H01L 33/52 |
| | | | | 257/98 |
| 2020/0287106 | A1* | 9/2020 | Xie | H01L 33/58 |

FOREIGN PATENT DOCUMENTS

| | | |
|---|---|---|
| CN | 101950788 A | 1/2011 |
| CN | 102282687 A | 12/2011 |
| CN | 103131190 A | 6/2013 |
| CN | 206388723 U | 8/2017 |
| CN | 109873069 | 6/2019 |
| CN | 209418552 | 9/2019 |
| DE | 202019105439 | 10/2019 |

* cited by examiner

LED DEVICE AND BACKLIGHT MODULE

CROSS-REFERENCE TO RELATED APPLICATIONS

This application claims priority to Chinese patent applications No. 201920296032.9, No. 201910177164.4 and No. 201910177276.X filed with the Patent Office of the People's Republic of China on Mar. 8, 2019, the disclosures of all of which are incorporated herein by reference in their entireties.

TECHNICAL FIELD

The present disclosure relates to a technical field of LED and, in particular, to an LED device and a backlight module.

BACKGROUND

As a new type of light source, LED devices have advantages of energy saving, high efficiency, long service life, environmental protection, etc. In different application scenarios of LED devices, requirements for the power angle of LED devices may be proposed. For example, in some application surfaces a half power angle, that is, a beam angle at a light intensity of 50%, is commonly used. The power angle is influenced by two factors, i.e., relative luminous intensity (also called luminous efficiency) and beam angle. For a LED device, there is a luminous region with luminous efficiency of 100%, but a region with high luminous efficiency (e.g., luminous efficiency is equal to or greater than 95%) often has a small beam angle (e.g., a beam angle is only 20°). The small beam angle affects the structural design of an application surface of the LED device (e.g., thickness of the backlight module). In the related art, an improvement to the beam angle of the LED device is mainly implemented through the design of a reflective surface and an chip encapsulation material. For example, an inclination of the reflective surface can be designed to achieve different reflecting angles, and an optically sparse medium or an optically dense medium can be selected as the encapsulation material to achieve different light permeabilities. However, for some application scenarios where both the luminous efficiency and the beam angle should be considered to be increased, techniques in the related art cannot meet such requirements.

SUMMARY

A purpose of the embodiments of the present disclosure is to provide a backlight module, which has characteristics such as a uniform light emission and a high light intensity.

In a first aspect, a LED device is provided, including a bracket, a LED chip, and an encapsulation layer.

A reflective cup is arranged on the bracket, and the LED chip is arranged in the reflective cup of the bracket.

The encapsulation layer encases the LED chip and encapsulates the LED chip in the reflective cup. The encapsulation layer has a top surface of the encapsulation layer. The top surface of the encapsulation layer is located above a top surface of the reflective cup, and the top surface of the encapsulation layer is a lens curved surface.

In an on-state of the LED chip, the LED device has multiple virtual cross sections passing through a geometrical center of the LED chip and perpendicular to a top surface of the bracket. In at least one of the virtual cross sections of the LED device, the LED device has luminous efficiency greater than or equal to 95% within a beam angle of at least 60°.

Through the above design, the LED device meets requirements that the luminous efficiency is greater than or equal to 95% within the beam angle of at least 60°. Such LED device has good luminous characteristics, and is especially suitable for an application scenario of a surface light source with certain light intensity requirements, such as a backlight module. In a second aspect, a backlight module is provided. The backlight module includes the LED device described above. The backlight module of this embodiment has characteristics such as a uniform light emission and a high light intensity.

DETAILED DESCRIPTION

The embodiments of the present disclosure will be described hereinafter in conjunction with the drawings. Apparently, the described embodiments are only part of the embodiments of the present disclosure, not all embodiments. Based on the embodiments of the present disclosure, all other embodiments obtained by those skilled in the art without creative work are within the protection scope of the present disclosure.

Figure 1:
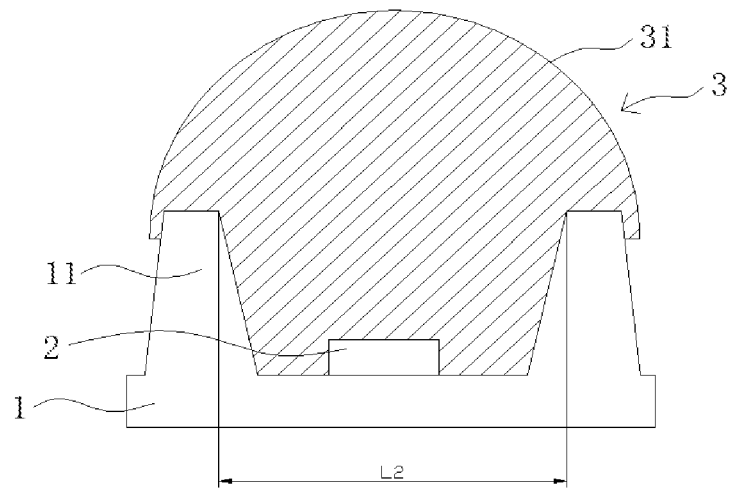
FIG. 1 is a structural diagram of a LED device according to an embodiment of the present disclosure.

FIG. 1 is a structural diagram of a LED device according to an embodiment of the present disclosure. As shown in FIG. 1, in the embodiment of the present disclosure, the LED device includes a bracket 1, a LED chip 2 and an encapsulation layer 3. The bracket 1 is provided with a reflective cup 11, which generally has a shape of a groove. The LED chip 2 is arranged in the reflective cup 11 of the bracket 1. The encapsulation layer 3 encases the LED chip 2 and encapsulates the LED chip 2 in the reflective cup 11. The encapsulation layer 3 has a top surface 31 of the encapsulation layer. The top surface 31 of the encapsulation layer is located above a top surface of the reflective cup 11, and the top surface 31 of the encapsulation layer is a lens curved surface.

The LED device of this embodiment also meets the requirements described below. In an on-state of the LED chip 2, the LED device has virtual cross sections passing through a geometrical center of the LED chip 2 and perpendicular to a top surface of the bracket 1. In at least one of the virtual cross sections, of the LED device has the luminous efficiency greater than or equal to 95% within a beam angle of at least 60°. As mentioned in the background, the luminous efficiency and the beam angle are a pair of mutually influencing parameters. Through the design of this embodiment, the LED device has a larger luminous efficiency and a larger beam angle. Such LED device can be applied to an application surface requiring a certain light intensity. Moreover, the larger beam angle it is also beneficial to a layout design of the LED device and the module.

Figure 2:
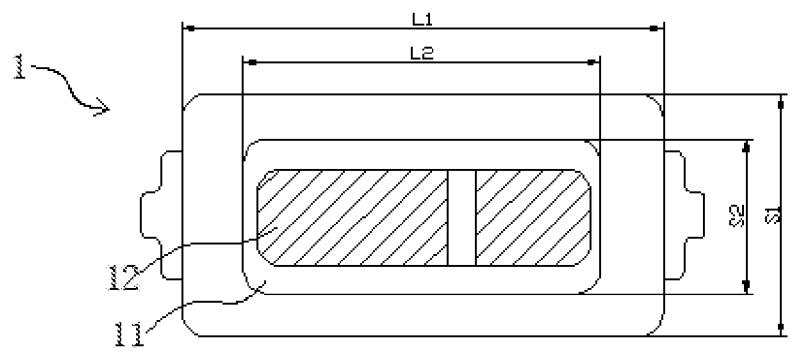
FIG. 2 is a top view structural diagram of a bracket of the LED device according to an embodiment of the present disclosure.

FIG. 2 is a top view of a bracket of the LED device according to an embodiment of the present disclosure. The bracket 1 in the embodiment of the present disclosure is provided with a reflective cup 11. Metal electrodes 12 insulated from each other are embedded in the bracket 1 and positioned on a bottom surface of the reflective cup 11. The metal electrodes 12 are used for wire bond of the LED chip 2 to realize external electrical connection of the LED chip 2, thereby to implement control of the LED chip 2 from outside. In this embodiment, the LED chip 2 is a blue light LED chip and has a peak wavelength in a range of 440 nm to 470 nm.

The bracket 1 in this embodiment generally has a shape of a rectangular, and a rim of the reflective cup 11 generally has a shape of a rectangle. The bracket 1 has a long edge with a length L1 and a short edge with a length S1, and the rim of the reflective cup 11 has a long edge with a length L2 and a short edge with a length S2. In an embodiment, the length L2 of the long edge of the rim of the reflective cup 11 is in a value range of [1.9 mm, 2.1 mm], and the length S2 of the short edge of the rim is in a value range of [1.5 mm, 1.7 mm]. A cup wall of the reflective cup 11 on the one hand ensures the safe encapsulation of the chip; and on the other hand, the cup wall of the reflective cup 11 is also a reflective surface for the light emitted by the LED device. Under the premise of meeting a minimum wall thickness of the reflective cup 11, the bracket 1 may have a correspondingly changed outer size. In an embodiment, the length L1 of the long edge of the bracket 1 may be set in a value range of [2.1 mm, 2.3 mm], and the length S1 of the short edge of the bracket 1 may be set in a value range of [1.55 mm, 1.8 mm].

Figure 3:
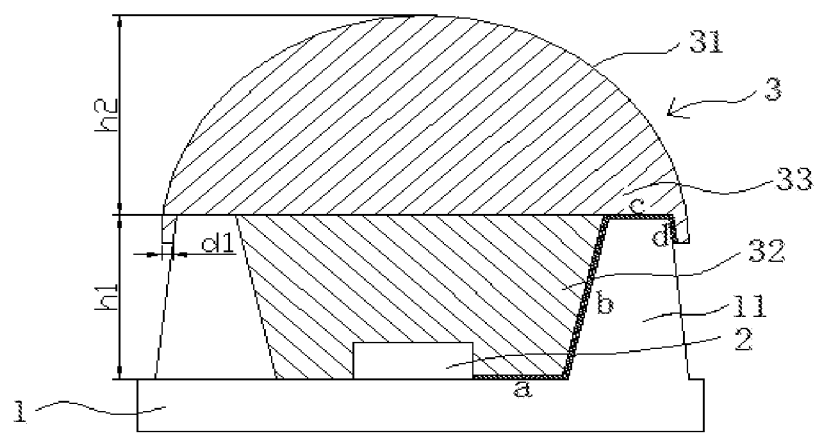
FIG. 3 is a structural diagram of a LED device according to another embodiment of the present disclosure.

In another embodiment of the present disclosure, as shown in FIG. 3, the encapsulation layer 3 may further include a first encapsulation layer 32 and a second encapsulation layer 33. The reflective cup 11 is filled up with the first encapsulation layer 32, so as to encapsulate the LED chip 2 in the reflective cup 11. The second encapsulation layer 33 is arranged on the first encapsulation layer 32. A top surface of the second encapsulation layer 33 is a lens curved surface. The first encapsulation layer 32 and the second encapsulation layer 33 of the encapsulation layer 3 may be molded separately to improve the molding quality. For example, the first encapsulation layer 32 may be formed first, and then the second encapsulation layer 33 may be formed on the first encapsulation layer 32, which helps to ensure a quality of the lens curved surface on the top surface of the second encapsulation layer 33.

In this embodiment, the first encapsulation layer 32 is formed along the surface of the bracket at an inner wall of the reflective cup 11 and the bottom of the reflective cup 11 to cover the LED chip 2. The second encapsulation layer 33 extends from a top surface of the first encapsulation layer 32 along the surface of the reflective cup 11 and covers the top surface of the reflective cup 11 and at least part of an outer wall of the reflective cup 11. It is understood that in other embodiments of the present disclosure, the second encapsulation layer 33 may be arranged only on the first encapsulation layer 32 and not in contact with the reflective cup 11.

As shown in FIG. 3, when the encapsulation layer 3 includes the first encapsulation layer 32 and the second encapsulation layer 33, under the premise of realizing protection of the LED chip 2, the first encapsulation layer 32 should have a thickness as small as possible and the second encapsulation layer 33 should have a height larger than the thickness of the first encapsulation layer 32, so as to reduce the influence on the luminous intensity of the LED chip 2 and the beam angle of the device. The reason is that when the thickness of the first encapsulation layer 32 is small enough, more light may be emitted directly outward from the reflective cup 11; the second encapsulation layer 33 has a lens-type top surface having a function of a magnifying lens, through which the light is emitted outward through the second encapsulation layer 33, thereby improving the luminous efficiency and increase the beam angle. Since the first encapsulation layer 32 is filled and molded in the reflective cup 11, the thickness of the first encapsulation layer 32 is determined by the depth of the reflective cup 11. In addition, due to process limitations and product requirements, the height of the second encapsulation layer 33 is limited. In an embodiment of the present disclosure, a ratio of a height h2 of the second encapsulation layer 33 to a depth h1 of the reflective cup 11 is in a range of [1.7, 2.3]. It should be noted that, the height h2 of the second encapsulation layer 33 refers to a vertical distance between a highest point of the top surface of the encapsulation layer 3 and the top surface of the bracket.

In some embodiments of the present disclosure, the depth h1 of the reflective cup 11 is in a value range of [0.25 mm, 0.45 mm]. The second encapsulation layer 33 extends from the top surface of the first encapsulation layer 32 and along the surface of the reflective cup 11. The bottom surface of the second encapsulation layer 33 covers the top surface of the reflective cup 11 and covers part of the outer wall of the reflective cup 11, and the top surface is a curved surface to the upper to achieve a function of a convex lens. The height h2 of the second encapsulation layer 33 is in a value range of [0.3 mm, 0.8 mm].

As shown in FIG. 3, a denotes a distance between the LED chip 2 and the inner wall of the reflective cup 11 in a direction shown in the figure, b denotes a contact length between the first encapsulation layer 32 and the inner wall of the reflective cup 11 in a direction shown in the figure, c denotes a contact length between the second encapsulation layer 33 and the top surface of the reflective cup 11 in a direction shown in the figure, and d denotes a contact length between the second encapsulation layer 33 and the outer wall of the reflective cup 11 in a direction shown in the figure. An ordinary LED device is only provided with the first encapsulation layer 32, as shown in the figure. In this case, the minimum distance for an external impurity to intrude from outside to the LED chip 2 along an interface between the encapsulation layer 3 and the bracket 1 is a+b. The encapsulation layer 3 of this embodiment includes the first encapsulation layer 32 and the second encapsulation layer 33. The minimum distance for the external impurity to intrude from the outside to the LED chip 2 along the interface between the encapsulation layer 3 and the bracket 1 is a+b+c+d. Compared with the design in the related art in which the LED device only has the first encapsulation layer 32, the minimum distance of the external impurity intruding the LED chip of this embodiment is increased, which is beneficial to improvement of airtightness of the LED device and reduction of a probability of corrosion failure of the LED chip. Moreover the second encapsulation layer 33 covers the top surface of the reflective cup 11, which is beneficial to increase of a bonding force between the encapsulation layer 3 and the bracket 1, and has a good reliability in practice.

The encapsulation layer 3 is formed through a glue dispensing (self-forming of glue) process or an injection molding process. In the embodiments of the present disclosure, the encapsulation layer 3 is formed through the glue dispensing process. Glue has a certain surface tension in a liquid state. Under the action of the surface tension, the glue can be solidified and molded on the top surface of the reflective cup 11 without surrounding support. Specifically, the surface tension exists at any position on a surface of the glue, which is specifically shown as a shrink force on the glue surface towards the inside of the glue. In a case of no external force, the glue will shrink into a sphere. Therefore, a lens curved surface is formed on the top surface of the encapsulation layer 3.

When the encapsulation layer 3 includes the first encapsulation layer 32 and the second encapsulation layer 33, the first encapsulation layer 32 and the second encapsulation layer 33 may be integrally formed. For example, the first encapsulation layer 32 and the second encapsulation layer 33 may be formed simultaneously in one-stage glue dispensing using the same glue. Glue with a volume larger than a volume of the reflective cup 11 is dropped into the reflective cup 11, the glue overflows the rim of the reflective cup 11. The top surface of the glue forms a lens curved surface under the action of the surface tension, after the glue is solidified, the first encapsulation layer 32 and the second encapsulation layer 33 are integrally formed.

When the encapsulation layer 3 is formed by the glue dispensing process, under the action of the surface tension, the glue in a liquid state tends to shrink into a sphere, an interaction force (mainly an intermolecular force) between the cup wall and the glue enables the glue to fill into the reflective cup 11 and contact with the cup wall of the reflective cup 11, in a natural state the glue surface overflowing the rim tends to shrink into a spherical surface. In this case, the amount of the glue plays a key role in molding effect of the encapsulation layer 3. If the glue has a too large amount, a large amount of glue will overflow; and if the glue has a too small amount, the lens curved surface of the encapsulation layer 3 will have a relatively small curvature and the curved surface will be relatively flat, which will affect the luminous effect. Therefore, according to the present disclosure, the ratio of the volume of the glue to the volume of the reflective cup 11 (a capacity of the reflective cup) is in a range of [2.83, 3.33]. In this design, a part of the dispensing glue beyond the volume of the reflective cup may form a lens curved surface on the top surface of the reflective cup.

In addition, extra glue overflows the reflective cup 11, when the extra glue on the outer wall of the reflective cup 11 has a thickness greater than 200 μm and has not yet solidified to form the encapsulation layer, there is a risk of glue outflowing caused by an insufficient surface tension. Therefore, the encapsulation layer 3 on the outer wall of the reflective cup 11 has the thickness d1 in a value range of (0 μm, 200 μm] to ensure the molding effect of the encapsulation layer. In order to ensure the implementation described above, on the one hand, it is necessary to control the amount of glue in the glue dispensing process; on the other hand, it is necessary to control the dispensing speed, which should not be too high.

Figure 4:
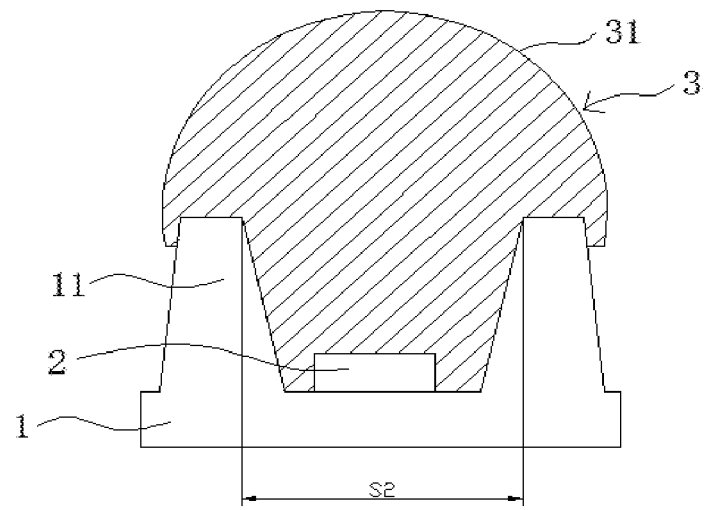
FIG. 4 is a side view structural diagram of the LED device according to an embodiment of the present disclosure.
Figure 5:
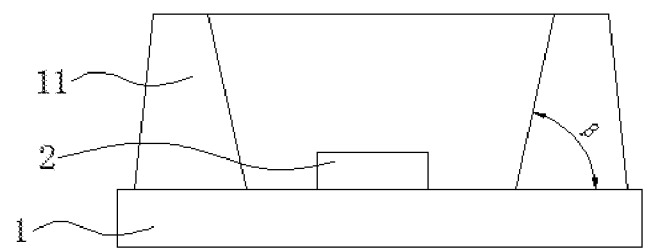
FIG. 5 is a front view structural diagram of the bracket of the LED device according to an embodiment of the present disclosure.
Figure 6:
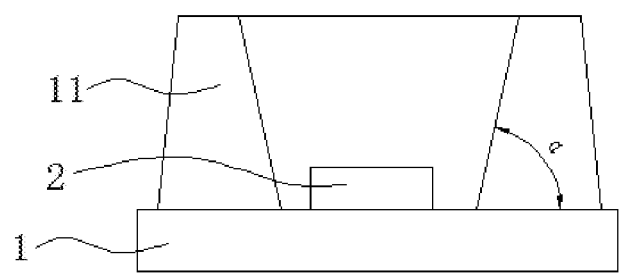
FIG. 6 is a side view structural diagram of the bracket of the LED device according to an embodiment of the present disclosure.

According to the structural diagrams of the LED device shown in FIGS. 1 and 4, under natural conditions, the top surface of the encapsulation layer 3 contacting with the long edge of the rim of the reflective cup 11 has a curved surface steeper than the top surface contacting with the short edge of the rim of the reflective cup 11, and the amount of the glue per unit area on the long edge of the rim of the reflective cup 11 acting upon the cup wall of the reflective cup 11 is larger than that of the glue on the short edge. Since a finally solidified and molded lens part needs to reach a certain height to achieve a relatively ideal luminous effect, in order to prevent the glue on the long edge of the reflective cup 11 from flowing out of the bracket 1 due to an excessive weight. As shown in FIGS. 5 and 6, an included angle is formed between a plane of the cup wall and a plane of the cup bottom. The included angle α on the long edge of the bracket 1 is smaller than the included angle β on the short edge of the bracket 1. Thus the cup wall on the long edge of the rim of the reflective cup 11 has an increased surface area, which increases the interaction force between the glue and the long edge of the rim of the reflective cup 11, increases the bearable weight of the glue on the long edge of the rim of the reflective cup 11, and thus is beneficial to increase of the height of the molded lens part.

In an embodiment of the present disclosure, the included angle α on the long edge of the bracket 1 is in a value range of [60°, 75°], and the included angle β on the short edge of the bracket 1 is in a value range of [70°, 85°].

In an embodiment of the present disclosure, the rim of the reflective cup 11 has a shape of a rectangular, and the rectangular has a width-to-length ratio in a value range of [0.75, 1]. It may be understood that the length of the rim of the reflective cup 11 and the width of the rim of the reflective cup 11 respectively refer to a length of the long edge and a length of the short edge of the rim of the reflective cup 11. Specifically, in a case where the encapsulation layer 3 uses the dispensing self-forming process, when the rim has a width-to-length ratio closer to 1, the top surface of a finally formed encapsulation layer 3 is closer to a lens curved surface of a convex lens in an ideal state; when the rim has a too small width-to-length ratio, the significant deformation of the lens part formed above the rim will seriously affect the beam angle. On the other hand, in an ideal state, when the rim of the reflective cup 11 has the shape of the circular, the top surface of the encapsulation layer 3 may easily form an ideal lens curved surface. However, in actual processing, the reflective cup 11 is injection molded by means of a mold. Compared with a circular mold, a rectangular mold has lower processing difficulty and thus has a better economy and practicability in practical processing.

Figure 7:
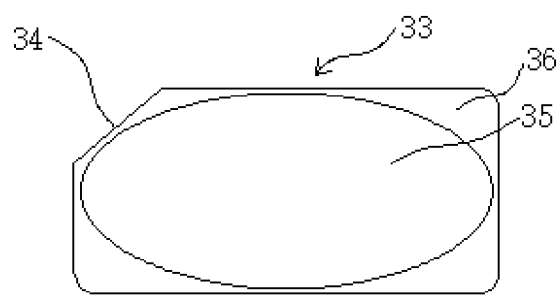
FIG. 7 is a structural diagram of an encapsulation layer according to an embodiment of the present disclosure.

FIG. 7 is a structural diagram of an encapsulation layer according to an embodiment of the present disclosure. As shown in FIG. 7, in an embodiment of the present disclosure, when the encapsulation layer 3 includes a first encapsulation layer 32 located in the reflective cup 11 and a second encapsulation layer 33 located on the first encapsulation layer 32. A notch 34 is arranged on periphery of the second encapsulation layer 33, and the top surface of the second encapsulation layer 33 is a lens curved surface. The notch 34 is used for the purpose of identifying a direction of the encapsulation layer 3, so as to facilitate installation. It may be understood that the first encapsulation layer 32 and the second encapsulation layer 33 may also be formed separately. At this time, the second encapsulation layer 33 has a function of a lens. For an application scenario of using the second encapsulation layer 33, in an embodiment of the present disclosure, the second encapsulation layer 33 may be mounted on the first encapsulation layer 32. In other embodiments, the encapsulation layer 33 may be directly mounted on the bracket 1 and cover the LED chip 2. At this time, at the bottom of the second encapsulation layer 33 a groove is arranged to provide a space for installing the LED chip 2.

In an actual measurement, the beam angle of the LED chip 2 mainly refers to an angle within which the relative light intensity (also known as luminous efficiency) is equal to or greater than 50%. The rest areas except the beam angle have a lower light intensity, and generate a smaller visual difference when the luminous effect changes. Therefore, when the second encapsulation layer 33 with notch of this embodiment is applied to a LED device, not all areas of the second encapsulation layer 33 with notch will affect the beam angle of the LED chip. Generally, a top surface located in the middle serves as a functional area 35 of the curved lens surface, the functional area 35 will affect the light within the beam angle range of the LED chip, which is one of the main influencing factors of the beam angle of the LED chip, while surrounding part of the functional area 35 will not affect the light within the beam angle range of the LED chip and the surrounding part is set as a non-functional area 36. In specific implementation, in order to avoid an influence of the lens on the beam angle of the LED device, the notch 34 may be arranged on the non-functional area 36.

Figure 8:
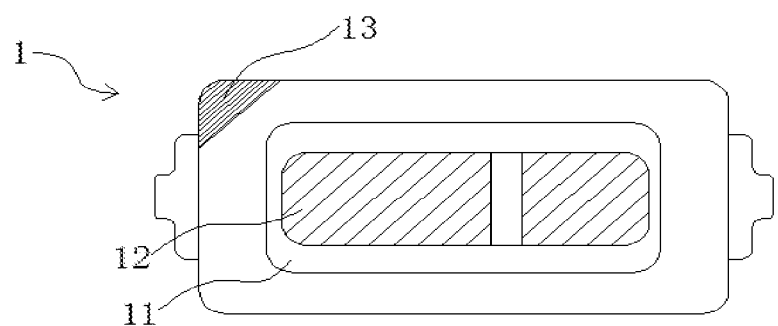
FIG. 8 is a structural diagram of the bracket according to an embodiment of the present disclosure.

In an embodiment of the present disclosure, the encapsulation layer 3 may be formed by the glue dispensing process and the notch 34 may be formed by cutting or other processes, the notch is processed without a high smoothness due to the material of the encapsulation layer. Therefore, this embodiment also provides a process for forming an encapsulation layer with notch. FIG. 8 is a structural diagram of a bracket according to an embodiment of the present disclosure. As shown in FIG. 8, specifically, the bracket 1 is processed at a position where an electrode mark is needed to form a bracket step 13. In the glue dispensing process, due to an arrangement of the bracket step 13, under the influence of a glue surface tension, a certain limited amount of glue will fill an interior of the reflective cup 11 first and then overflow from the rim of the reflective cup 11; after the glue overflows, the glue has a continuously increasing height, and will spread to cover the top surface of the reflective cup 11 and not flow onto the bracket step 13; until the glue is solidified, a molded encapsulation layer 3 forms the notch 34 at the position of the bracket step 13.

According to the LED device provided by an embodiment of the present disclosure, the notch 34 may be arranged at any position of the encapsulation layer for identifying the direction of the encapsulation layer. When the notch 34 is combined and applied to the LED device, the notch 34 of the encapsulation layer with notch is located on a same side with one of electrodes of the LED device, so that the notch 34 can identify the direction of the encapsulation layer with notch and also the polarity of the LED device, which has a good practicability in an actual use.

Figure 9:
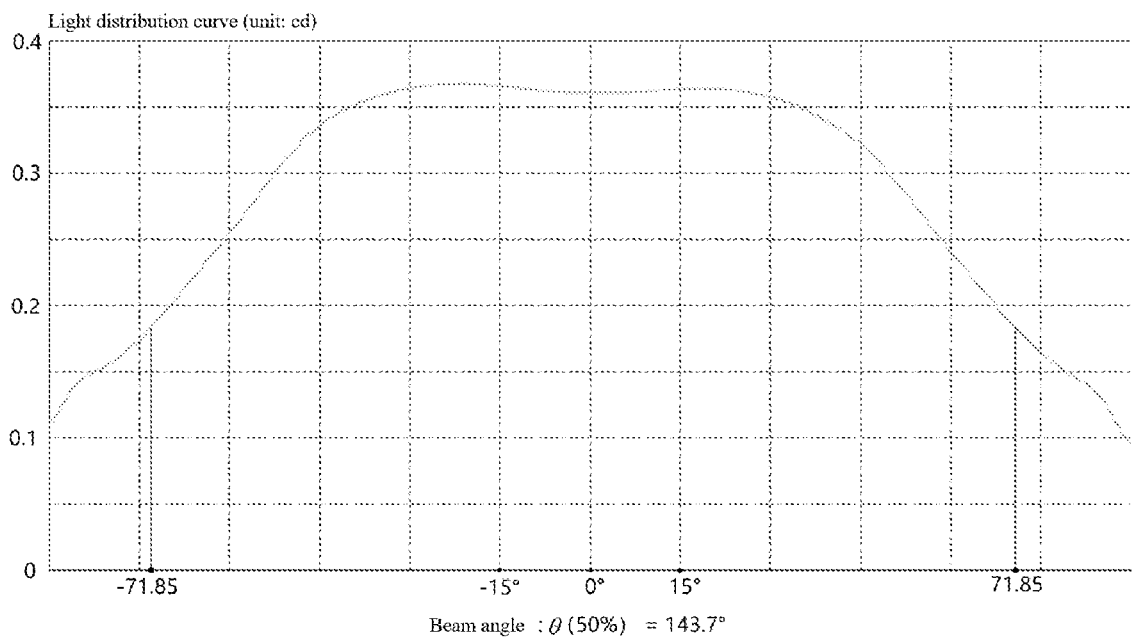
FIG. 9 is a light distribution curve of the LED device according to an embodiment of the present disclosure.
Figure 10:
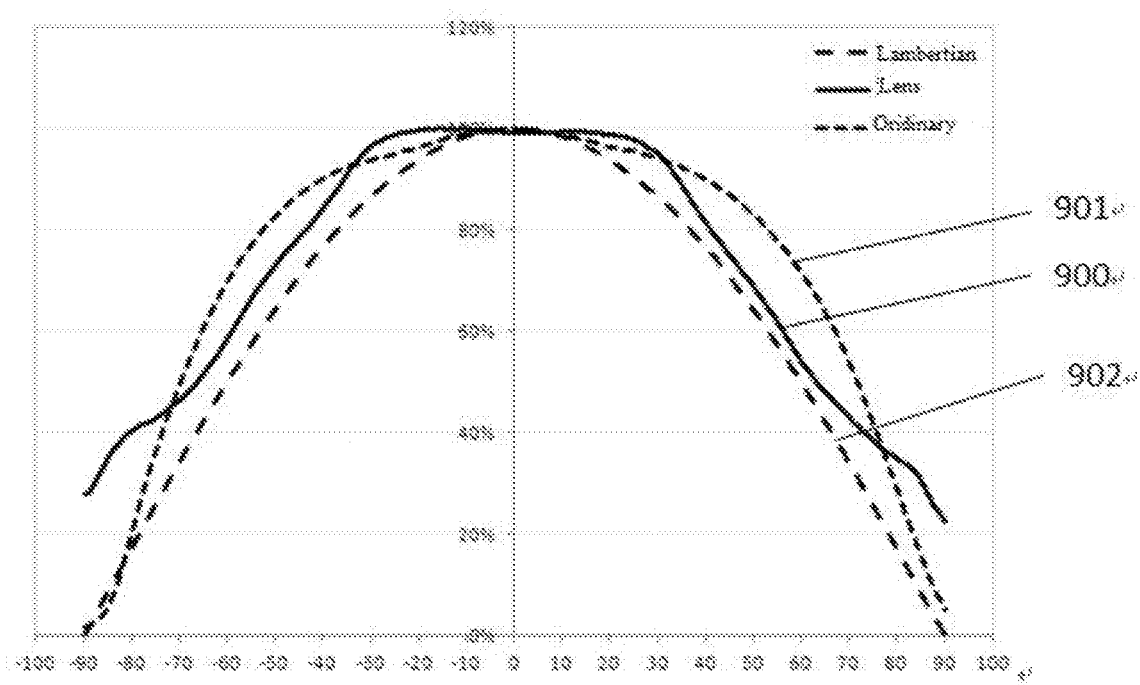
FIG. 10 is a comparison diagram of light distribution curves of different kinds of LED devices according to an embodiment of the present disclosure.

FIG. 9 shows a light distribution curve of the LED device according to an embodiment of the present disclosure, and FIG. 10 shows a comparison diagram of light distribution curves of different kinds of LED devices. Since the LED device in the embodiments of the present disclosure does not have a fixed size, the light distribution curve of the LED device shown in FIG. 9 merely illustrates a light distribution curve of a kind of LED devices with a lens curved surface. According to a light distribution curve of the LED device based on actual measurement and through analysis of energy spectrum, the lens curve surface provided for the LED device may keep the luminous efficiency above 95% in a beam angle range of [−30°, 30°]; and the LED device may keep the luminous efficiency above 50% in a beam angle range of [−65°, 65°]. In FIG. 10, a first curve 902 is a light distribution curve of a LED device with Lambertian emission mode, a second curve 900 is a light distribution curve of the LED device provided with the lens curved surface in the embodiments of the present disclosure, a third curve 901 is a light distribution curve of an ordinary LED device (i.e., the LED device has an encapsulation part filled only in the reflective cup fills up an encapsulation part without a lens curved surface). Specifically, within a beam angle range of [−30°, 30°], the ordinary LED device has a luminous efficiency of more than 90%, and the LED device with Lambertian emission mode has a luminous efficiency of more than 85%. Compared with the LED device with Lambertian emission mode and the ordinary LED device, the LED device in the embodiments of the present disclosure has the luminous efficiency of 95% or even higher. In practical applications, the LED device of the present disclosure will form a luminous surface with a high and more uniform light intensity, and is especially suitable for an application scenario of a surface light source with a certain light intensity, such as a backlight module.

In the embodiments of the present disclosure, according to implementation of the LED device of the embodiments of the present disclosure, an axis passing through a geometric center of the LED chip 2 and perpendicular to the top surface of the bracket 1 serves as a reference angle of 0°, and an intersection point of the axis and the LED chip 2 serves as a base point, in the on-state of the LED chip, the LED device has multiple virtual cross sections passing through the geometrical center of the LED chip and perpendicular to the top surface of the bracket. The LED device of embodiments of the present disclosure has a luminous efficiency greater than or equal to 50% within a beam angle of at least 130° at any virtual cross-sections. Since the LED device actually consists of multiple virtual cross sections, the LED device of this embodiment has an actual beam angle of at least 130° and the luminous efficiency reaches at least 50%. When the luminous efficiency of an application surface of the LED device needs to be above 50%, the LED device of this embodiment has a beam angle of 130°, the chip has a shorter light mixing area, and it is beneficial to miniaturing application products such as a backlight. In an embodiment, the beam angle is in a range of [−75°, 75°].

In another embodiment of the present disclosure, at least one of the virtual cross sections of the LED device has the luminous efficiency greater than or equal to 90% within a beam angle of at least 70°. In an embodiment, the beam angle is in a range of [−45°, 45]. In another embodiment of the present disclosure, at least one of the virtual cross sections of the LED device has the luminous efficiency greater than or equal to 95% within a beam angle of at least 60°. In a case where the application surface of the LED device requires the luminous efficiency to be above 95%, the LED device of this embodiment has a beam angle of 60°, which is increased by 3 times compared with a beam angle of about 20° in the related art. In this application scenario where the LED device has a large beam angle, the LED device has a more diversified layout and an increased application range. In an embodiment, the beam angle is in a range of [−40°, 40°].

Figure 11:
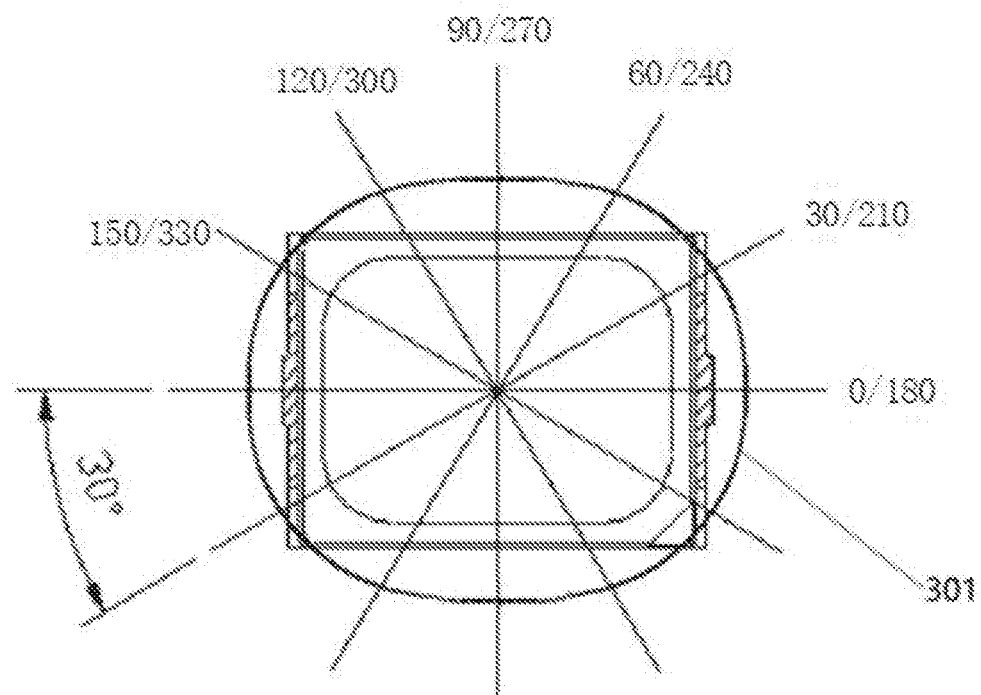
FIG. 11 is a diagram illustrating dimensioned angles of various cross sections of the LED device according to an embodiment of the present disclosure.

In an embodiment of the present disclosure, as shown in FIG. 11, the bracket 1 has a long edge and a short edge adjacent to each other. The LED device has a reference cross section at an angle of 0°. The reference cross section passes through the geometric center of the LED chip, is perpendicular to the top surface of the bracket and parallel to the long edge of the bracket. When an included angle between the virtual cross section and the reference cross section is in a range of [60°, 120°], each of the virtual cross sections of the LED device has the luminous efficiency greater than or equal to 95% within a beam angle of at least 60°. This embodiment further specifies that with an included angle range of [60°, 120°] to the reference cross section the LED device has a luminous efficiency of at least 95%, and the beam angle is at least of 60°. When the application surface of the LED device requires the luminous efficiency to be above 95%, the LED device may be installed and arranged at any angle within the above-mentioned angle range, which may meet requirements. It should be noted that the beam angle in the present disclosure is set to 0° in the reference cross section, and is set to be negative and positive on respective sides of the reference cross section. For example, the beam angle is in a range of [−30°, 30°].

Figure 12:
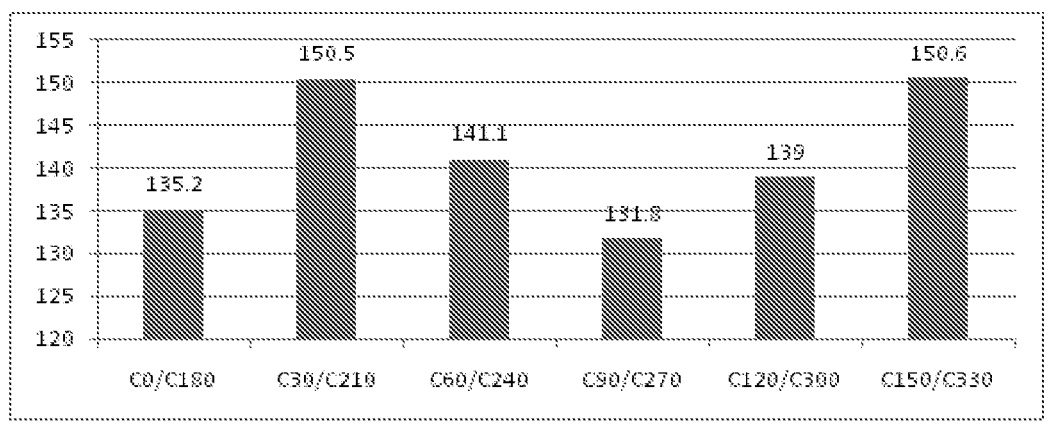
FIG. 12 is a histogram of beam angles of various cross sections at different angles of the LED device according to an embodiment of the present disclosure.

FIG. 11 shows a diagram illustrating dimensioned angles of various cross sections of the LED device according to an embodiment of the present disclosure, and FIG. 12 shows a histogram of beam angles of various cross sections at different angles of the LED device according to an embodiment of the present disclosure. As shown in FIGS. 11 and 12, the analysis of beam angles of the cross sections of the LED device shows the existence of a certain difference in the beam angle (at a luminous efficiency of 50%) among the cross sections. Specifically, the LED device has multiples virtual cross sections passing through the geometrical center of the LED chip and perpendicular to the top surface of the bracket. In the virtual cross sections, the larger a length of a projection of the lens top surface of the LED device on the top surface of the bracket is, the larger the beam angle is. In other words, the beam angle of the LED device is in direct proportion to the length of a projection of the top surface of the encapsulation layer on the top surface of the bracket. Specifically, from a cross section at 0°/180° to a cross section where a diagonal line of the rim of the reflective cup is located (a cross section where a diagonal line at an angle close to 30°/210° is located), the beam angle of the LED device on the virtual cross section gradually increases.

From the cross section where the diagonal line of the rim of the reflective cup is located (a cross section where the diagonal line at an angle close 30°/210° is located) to a cross section at 90°/270°, the beam angle of the LED device on the virtual cross section gradually decreases.

From the cross section at 90°/270° to a cross section where a diagonal line of the rim of the reflective cup is located (a cross section where a diagonal line at an angle close to 120°/300° is located), the beam angle of the LED device on the virtual cross section gradually increases.

From the cross section where the diagonal line of the rim of the reflective cup is located (the cross section where the diagonal line at the angle close to 120°/300° is located) to the cross section at 0°/180°, the beam angle of the LED device on the virtual cross section gradually decreases.

Specifically, FIG. 12 shows beam angles of the LED device at special angles. The lamination angles are measured for the cross sections at different angles, and the beam angles of the cross sections at different angles of the LED devices are converted into lengths by a fixed proportion and plotted on a same figure, so as to obtain a luminous surface 301 of the LED device as shown in FIG. 11. The luminous surface 301 of the LED device only shows a proportional relationship between the beam angles of the cross sections, other than an actual luminous surface. When multiple LED devices are combined to form a backlight module, the LED devices may be arranged according to the luminous surface 301 of the LED device, to realize a relatively uniform illumination.

The embodiments of the present disclosure further provide a backlight module, which includes any one of the above described LED devices. The encapsulation layer with a lens curved surface of the LED device in this embodiment is molded based on one-stage glue dispensing, which has a simple manufacturing process with low manufacturing cost and is beneficial to a mass industrialized production. The LED device may maintain a relative light intensity of 95% or even higher within an angle of 60°. Such device has good luminous characteristics, and it is especially suitable for the application scenario of a surface light source with certain light intensity requirements, such as a backlight module. When the device is applied to a backlight module, the backlight module has characteristics such as a uniform illumination and a high light intensity.

What is claimed is:

1. A LED device, comprising a bracket, a LED chip and an encapsulation layer;
    wherein a reflective cup is arranged on the bracket, and the LED chip is arranged in the reflective cup of the bracket;
    wherein the encapsulation layer encases the LED chip and encapsulates the LED chip in the reflective cup, the encapsulation layer has a top surface of the encapsulation layer, the top surface of the encapsulation layer is located above a top surface of the reflective cup, and the top surface of the encapsulation layer is a lens curved surface;
    wherein in an on-state of the LED chip, the LED device has a plurality of virtual cross sections passing through a geometrical center of the LED chip and perpendicular to a top surface of the bracket, wherein in at least one of the plurality of virtual cross sections of the LED device, the LED device has luminous efficiency greater than or equal to 95% within a beam angle of at least 60°;
    wherein the encapsulation layer comprises a first encapsulation layer in the reflective cup and a second encapsulation layer arranged on the first encapsulation layer, a notch is arranged on periphery of the second encapsulation layer, and a top surface of the second encapsulation layer is a lens curved surface; and
    wherein a bracket step is formed on the bracket and is at a corner of the bracket, and the notch of the second encapsulation layer is formed at a position of the bracket step.

2. The LED device according to claim 1, wherein in at least one of the plurality of virtual cross sections of the LED device, the LED device has luminous efficiency greater or equal to 90% within a beam angle of at least 70°.

3. The LED device according to claim 1, wherein the bracket has a long edge and a short edge adjacent to each other, and a cross section of the LED device passing through the geometric center of the LED chip, perpendicular to the top surface of the bracket and parallel to the long edge of the bracket serves as a reference cross section for the plurality of virtual cross sections, the reference cross section is at an angle of 0°;

wherein in each virtual cross section of the LED device forming an included angle in a range of [60°, 120°] with the reference cross section, the LED device has luminous efficiency greater than or equal to 95% within the beam angle of at least 60°.

4. The LED device according to claim 1, wherein on the plurality of virtual cross sections, the beam angle of the LED device is in direct proportion to a length of a projection of the top surface of the encapsulation layer on the top surface of the bracket.

5. The LED device according to claim 1, wherein the encapsulation layer covers the top surface of the reflective cup and covers an outer wall of the reflective cup at least in part, and the encapsulation layer covering the outer wall of the reflective cup has a thickness in a value range of (0 μm, 200 μm].

6. The LED device according to claim 1, wherein a rim of the reflective cup has a shape of a rectangle, a rectangle with rounded corners, or a circle;

wherein when the rim of the reflective cup has the shape of the rectangle or the rectangle with rounded corners, the rim has a width-to-length ratio in a value range of [0.75, 1].

7. The LED device according to claim 6, wherein when the rim of the reflective cup has the shape of the rectangle or the rectangle with rounded corners, the rim of the reflective cup has a long edge having a length in a value range of [1.9 mm, 2.1 mm] and a short edge having a length in a value range of [1.5 mm, 1.7 mm];

wherein the bracket has a long edge having a length in a value range of [2.1 mm, 2.3 mm] and a short edge having a length in a value range of [1.55 mm, 1.8 mm].

8. The LED device according to claim 1, wherein the bracket has a long edge and a short edge adjacent to each other, the reflective cup has a cup wall and a cup bottom, an included angle is formed between a plane of the cup wall and a plane of the cup bottom, wherein the included angle is an included angle α on the long edge of the bracket and is an included angle β on the short edge of the bracket, the included angle α is smaller than the included angle β.

9. The LED device according to claim 8, wherein the included angle α is in a value range of [60°, 75°], and the included angle β is in a value range of [70°, 85°].

10. The LED device according to claim 1, wherein the LED chip is a blue light LED chip and has a peak wavelength in a range of [440 nm, 470 nm].

11. The LED device according to claim 1, wherein a vertical distance h2 between a highest point of the top surface of the encapsulation layer and the top surface of the bracket is in a value range of [0.3 mm, 0.8 mm].

12. The LED device according to claim 1, wherein a ratio of a vertical distance h2 between a highest point of the top surface of the encapsulation layer and the top surface of the bracket to a depth h1 of the reflective cup is in a range of [1.7, 2.3].

13. The LED device according to claim 1, wherein the encapsulation layer is formed through at least one of a glue dispensing process or an injection molding process.

14. The LED device according to claim 1, wherein when the encapsulation layer is formed through a glue dispensing process, a volume ratio of glue to the reflective cup is [2.83, 3.33].

15. A backlight module, comprising the LED device according to claim 1.

* * * * *